United States Patent
Goel et al.

(10) Patent No.: US 8,836,363 B2
(45) Date of Patent: Sep. 16, 2014

(54) PROBE CARD PARTITION SCHEME

(75) Inventors: Sandeep Kumar Goel, San Jose, CA (US); Mill-Jer Wang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 209 days.

(21) Appl. No.: 13/273,633

(22) Filed: Oct. 14, 2011

(65) Prior Publication Data

US 2013/0093452 A1    Apr. 18, 2013

(51) Int. Cl.
*G01R 31/00*  (2006.01)
*G01R 31/28*  (2006.01)
*G01R 31/319*  (2006.01)

(52) U.S. Cl.
CPC ...... *G01R 31/2889* (2013.01); *G01R 31/31908* (2013.01)
USPC .................................... 324/756.03

(58) Field of Classification Search
USPC ............. 324/756.03, 762.01–762.04, 754.01, 324/754.03, 754.08
See application file for complete search history.

(56) References Cited

U.S. PATENT DOCUMENTS

| | | | | |
|---|---|---|---|---|
| 5,124,646 A * | 6/1992 | Shiraishi | .................. | 324/756.03 |
| 5,525,912 A * | 6/1996 | Momohara | ............... | 324/750.22 |
| 5,616,931 A * | 4/1997 | Nakamura et al. | .............. | 257/48 |
| 5,736,850 A * | 4/1998 | Legal | ....................... | 324/754.07 |
| 5,818,249 A * | 10/1998 | Momohara | ............... | 324/756.03 |
| 6,639,420 B1 * | 10/2003 | Chen et al. | ................ | 324/754.03 |
| 7,459,925 B1 * | 12/2008 | Wu | ............................ | 324/756.03 |
| 2005/0277323 A1 * | 12/2005 | Eldridge et al. | .............. | 439/482 |
| 2006/0279003 A1 * | 12/2006 | Maruyama et al. | ............ | 257/797 |

FOREIGN PATENT DOCUMENTS

| | | |
|---|---|---|
| CN | 101889338 | 11/2010 |
| JP | 2005136302 | 5/2005 |

* cited by examiner

*Primary Examiner* — Patrick Assouad
*Assistant Examiner* — Demetrius Pretlow
(74) *Attorney, Agent, or Firm* — Lowe Hauptman & Ham, LLP

(57) ABSTRACT

A method of probe card partitioning for testing an integrated circuit die includes providing a first probe card partition layout having a first number of distinct sections. Each distinct section uses a distinct probe card for testing. The first probe card partition layout is repartitioned into a second probe card partition layout having a second number of distinct sections. The second number is less than the first number.

20 Claims, 7 Drawing Sheets

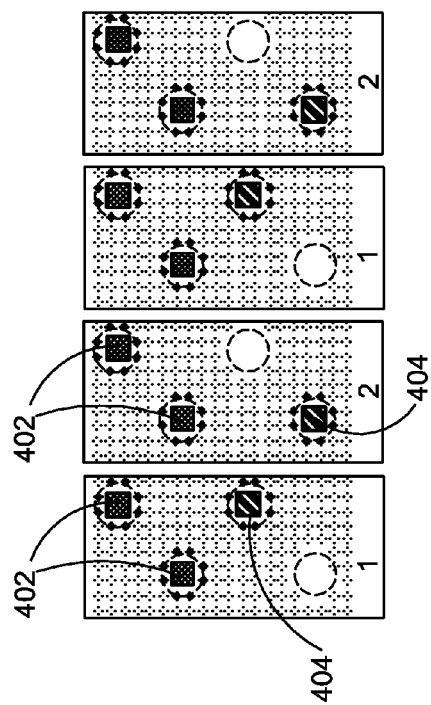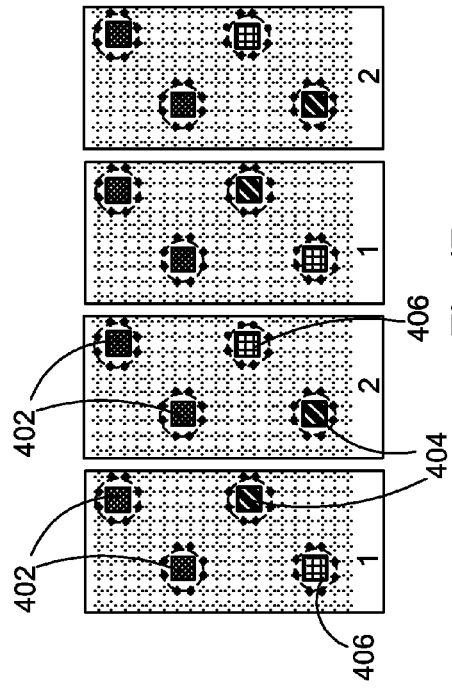
Fig. 4A
Fig. 4B

PROBE CARD PARTITION SCHEME

TECHNICAL FIELD

The present disclosure relates generally to an integrated circuit test and, more particularly, to a probe card.

BACKGROUND

More integrated circuit (IC) devices have higher pin counts for more advanced applications. Many conventional ICs, as well as 3-dimensional (3D) or 2.5D ICs, have a large number of pins. For testing ICs with high pin counts, a tester pin count limit constrains the testing of the ICs. Also, customized probe cards for the IC testing can be very expensive. If a tester pin count is less than the pin count of the tested IC, multiple insertions of the IC wafer for testing using multiple probe cards may be necessary, which increases the testing time and cost.

BRIEF DESCRIPTION OF THE DRAWINGS

Reference is now made to the following descriptions taken in conjunction with the accompanying drawings, in which:

FIG. 4A is an exemplary test contact pattern in a interlaced probe card partition layout according to some embodiments;

FIG. 4B is the exemplary test contact pattern in FIG. 4A with dummy contact pattern insertion for probe card reuse according to some embodiments;

DETAILED DESCRIPTION

Figure 1A:
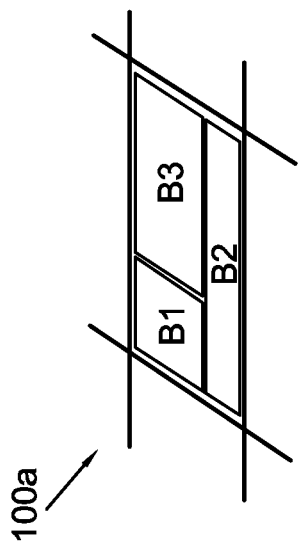
FIG. 1A is an exemplary probe card partition layout for an integrated circuit die that can be repartitioned for probe card reuse.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is an exemplary probe card partition layout for an integrated circuit die that can be repartitioned for probe card reuse. The probe card partition layout 100a includes sections B1, B2, and B3. The three sections B1, B2, and B3 have different shapes and areas. Therefore, each section requires a different probe card. The integrated circuit die testing with probe card partition layout 100a would have 3 probe cards, 3 wafer insertions (to the prober equipment), and 3 probing steps.

Figure 1C:
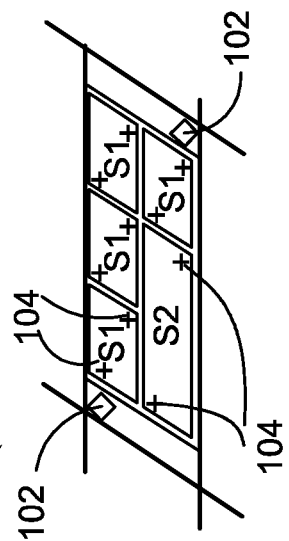
FIG. 1C is another exemplary probe card partition layout repartitioned from the layout of FIG. 1A for probe card reuse according to some embodiments.
Figure 1B:
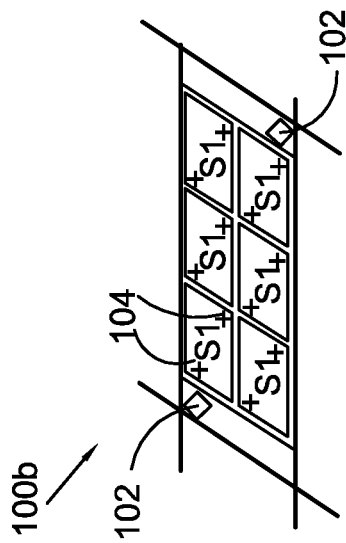
FIG. 1B is an exemplary probe card partition layout repartitioned from the layout of FIG. 1A for probe card reuse according to some embodiments.

FIG. 1B is an exemplary probe card partition layout repartitioned (re-layout) from the layout of FIG. 1A for probe card reuse according to some embodiments. The probe card partition layout 100b includes (partition) sections S1. Each section S1 is repeated 6 times to cover the same integrated circuit die area as the three sections B1, B2, and B3 in FIG. 1A. Each section S1 has the same test contact patterns (e.g., pad pattern) for a probe card. (Test contacts or pads on an integrated circuit comprise electrically conductive material such as metal and provide electrical contact points for the probe card.)

For testing, die-level alignment marks 102 are used to align the integrated circuit die and section-level alignment marks 104 are used to align the sections S1 with the probe card. The number of test contacts of each partition S1 of the probe card partition layout 100b is limited within a tester pin count specification.

Repartitioning of the testing area helps to keep testing pin counts within a specified tester pin count limit, and enables efficient wafer-level testing for large pin count devices by reusing the same probe card multiple times. For the reparation, dummy pads may be added to provide uniform sections. For example, some integrated circuit area in the six sections S1 in FIG. 1B can include dummy patterns to provide uniform probe card interface to reuse the same probe card for the sections S1. An illustrative example of dummy pads is described further in FIGS. 4A-4B.

Also, the test contacts (such as pads or -bumps) of each probe card partition section may be limited within the tester pin count. Reducing the number of distinct probe card partition sections results in cost reduction. For example, the three distinct probe card partition section B1, B2, and B3 in FIG. 1A are reduced to one probe card partition section S1 (reused six times) in FIG. 1B.

The integrated circuit die testing with probe card partition layout 100b would have 1 probe card, 1 wafer insertion (to the prober equipment), and 6 probing steps (reusing one probe card six times). The 6 probing steps include moving and aligning the probe card and the integrated circuit die for each section S1. Since the probe card cost is relatively large, the probe card partition layout 100b reusing 1 probe card for multiple sections S1 can save costs compared to the probe card partition layout 100a that requires 3 probe cards.

FIG. 1C is another exemplary probe card partition layout repartitioned from the layout of FIG. 1A for probe card reuse according to some embodiments. The probe card partition layout 100c includes multiple sections S1 and S2. The section S2 with different size from the section S1 is used in this example because the integrated circuit included in section S2 cannot be tested properly if divided into sections S1 as shown in FIG. 1B. In some embodiments, the area of section S2 is multiple times (e.g., 2 times) of the area of section S1.

Each probe card partition section such as S1 and S2 in FIG. 1C has a specified testing interface. For example, each probe card partition section has a different test contact pattern (layout) for electrical contacts, which includes different locations or incompatible pin types, such as power, ground, or signal. Each probe card partition section such as S1 and S2 in FIG. 1C has specified alignment marks 104 for testing alignment. The number of test contacts of each partition S1 or S2 of the probe card partition layout 100c is limited within a tester pin count specification limit.

The integrated circuit die testing with probe card partition layout 100c would have 2 probe cards, 2 time wafer insertion (to the prober equipment), and 5 probing steps (reusing one probe card for the section S1 four times and another probe card for the section S2 one time). The five probing steps include moving and aligning the probe card and the integrated circuit die four times for each section S1. Since the probe card cost is relatively large, the probe card partition layout 100c with 2 probe cards (reusing 1 probe card for multiple sections S1) can save costs compared to the probe card partition layout 100a that requires 3 probe cards.

By using the probe card reuse scheme as described above, high pin count IC testing can be performed with a reduced number of probe cards with less manufacturing costs. Also, the wafer insertion time, e.g., loading and preheat, is reduced due to the reduced number of probe cards. Even though FIG. 1B and FIG. 1C illustrate two examples of probe card partition layouts, there can be many different partition layouts depending on the tested integrated circuit, probe card size, cost, etc.

Figure 2A:
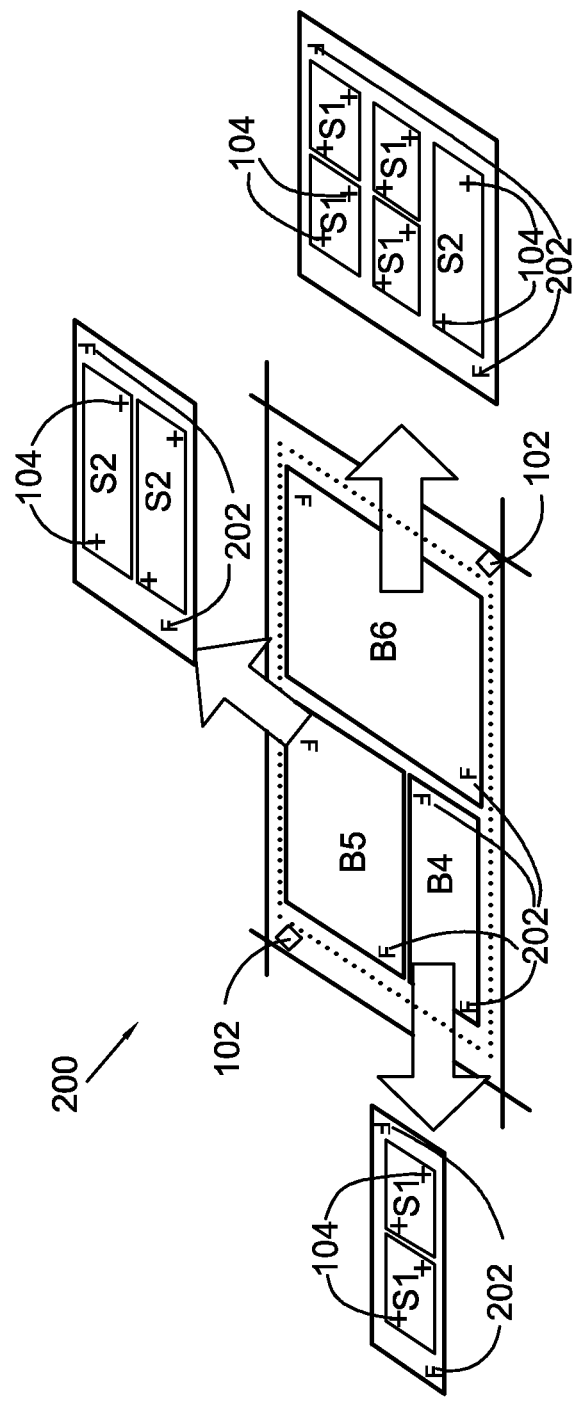
FIG. 2A is another probe card partition layout of an integrated circuit die repartitioned for probe card reuse according to some embodiments.

FIG. 2A is another probe card partition layout of an integrated circuit die repartitioned for probe card reuse according to some embodiments. The probe card partition layout 200 includes sections B4, B5, and B6, having alignment marks 202 for testing alignment. The three sections B4, B5, and B6 have different shapes and areas. The die-level alignment marks 102 and section-level alignment marks 202 are used for testing alignment. Without repartitioning of the probe card partition layout, each section requires a different probe card. The integrated circuit die testing with the probe card partition layout 200 would have 3 probe cards, 3 wafer insertions (to the prober equipment), and 3 probing steps.

For repartition, the section B4 is divided into two sections S1, the section B5 is divided into two sections S2, the section B6 is divided into four sections S1 and one section S2. Each section has alignment marks 104 for testing alignment. After the repartition using sections S1 and S2, the integrated circuit die testing with repartitioned probe card partition layout would have 2 probe cards, 2 wafer insertions (to the prober equipment), and 9 probing steps (reusing one probe card for the section S1 six times and another probe card for the section S2 three times). After the repartition, testing cost is reduced because the repartitioned probe card partition layout only uses 2 probe cards compared to 3 probe cards prior to the repartition.

Figure 2B:
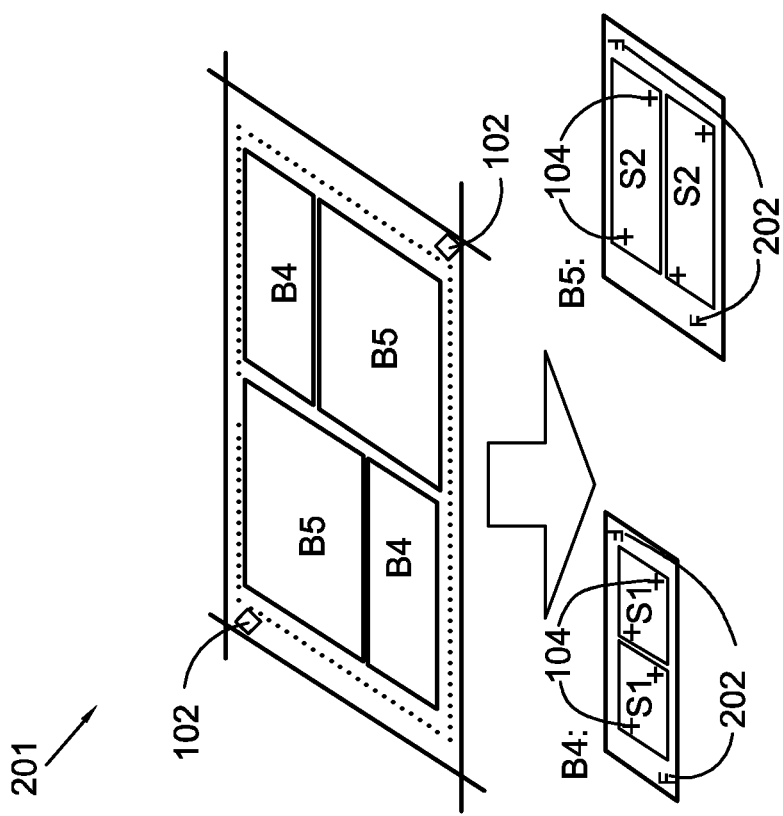
FIG. 2B is a backside probe card partition layout of the integrated circuit die in FIG. 2A repartitioned for probe card reuse according to some embodiments.

FIG. 2B is a backside probe card partition layout of the integrated circuit die in FIG. 2A repartitioned for probe card reuse according to some embodiments. Assuming that the integrated circuit die in FIG. 2A has the backside 201 as shown in FIG. 2B, the backside probe card partition layout is repartitioned using the same sections as the front side repartition in FIG. 2A. For example, each B4 section is divided into two sections S1 and each B5 section is divided into two sections S2. After the repartition using sections S1 and S2, the backside integrated circuit die testing with repartitioned probe card partition layout would have 2 probe cards, 2 times wafer insertion (to the prober equipment), and 8 probing steps (reusing one probe card for the section S1 four times and another probe card for the section S2 four times).

The testing cost for the backside itself is similar with or without repartition because of the same number of probe cards used (2), but since the same probe card partition S1 and S2 that are used for the front side in FIG. 2A are reused for the backside, the total testing cost for both the front side in FIG. 2A and the backside in FIG. 2B is reduced because the repartitioned probe card partition layout only uses 2 probe cards (corresponding to S1 and S2) compared to 3 probe cards (corresponding to B4, B5, and B6) prior to the repartition.

Figure 3A:
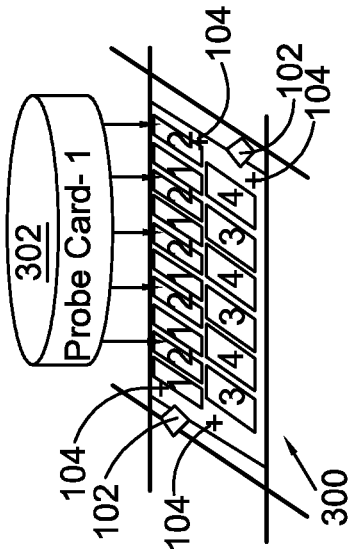
FIGS. 3A-3D are intermediate steps of an exemplary integrated circuit testing with a probe card partition layout having interlaced patterns according to some embodiments.
Figure 3B:
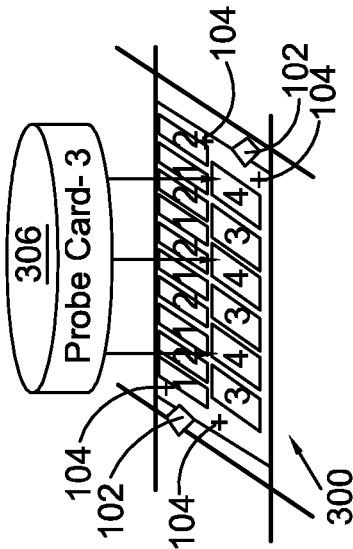

FIG. 3A is the first step of an exemplary integrated circuit testing with a probe card partition layout having interlaced patterns according to some embodiments. A probe card partition layout 300 has section 1 and section 2 interlaced, and section 3 and section 4 interlaced. The die-level alignment marks 102 and section-level alignment marks 104 help aligning probe cards. The probe card 302 for section 1 is used for testing section 1 in the first step. At the second step in FIG. 3B, the same probe card 302 for section 1 is reused for testing section 2. The section 1 and section 2 have the same dimensions and test contact patterns for electrical contact of the probe card 302. Reuse of the probe card 302 for section 1 and section 2 may need dummy pad insertion as described below in FIGS. 4A-4B as an example.

Figure 3C:
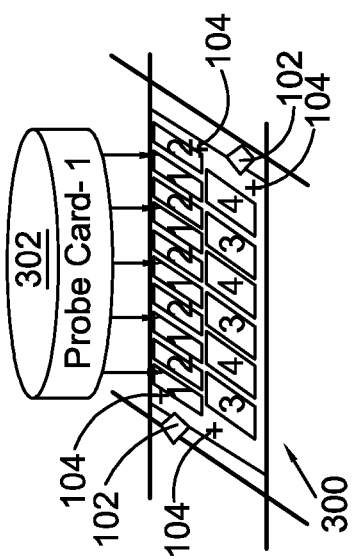
Figure 3D:
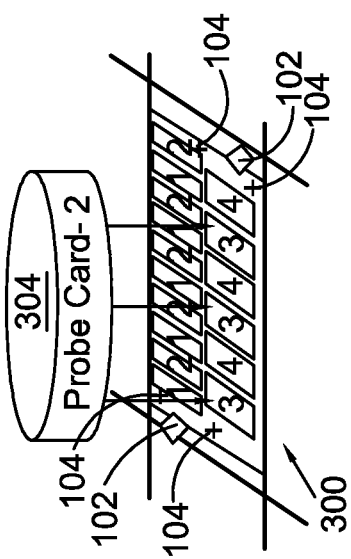

At the third step in FIG. 3C, a different probe card 304 for section 3 is used, because section 3 has different dimensions and/or test contact patterns for electrical contact from section 1 or section 2. At the fourth step in FIG. 3D, a different probe card 306 for section 4 is used, because section 4 has different dimensions and/or test contact patterns for electrical contact from section 1, section 2, and section 3. With the exemplary four-step probe card reuse scheme for testing shown in FIGS. 3A-3D, the testing would have 3 probe cards, 3 wafer insertions (to the prober equipment), and 4 probing steps.

FIG. 4A is an exemplary test contact pattern in an interlaced probe card partition layout according to some embodiments. Section 1 and section 2 have the same dimension (size) but different test contact pattern. Pads 402 have common pad locations (within each section) between interlaced section 1 and section 2. Pads 404 have different pad locations (within each section) between interlaced section 1 and section 2. The locations of the pads 404 are compatible for dummy pattern insertion because they don't overlap or interfere with each other.

FIG. 4B is the exemplary test contact pattern in FIG. 4A with dummy contact pattern insertion for probe card reuse according to some embodiments. The pads 402 are the same as the in FIG. 4A. The dummy pads 406 are inserted to have a uniform test contact pattern for section 1 and section 2. A probe card having the same test contact pattern and dimension can be reused for section 1 and section 2 after the dummy pad insertion in the integrated circuit.

Figure 4C:
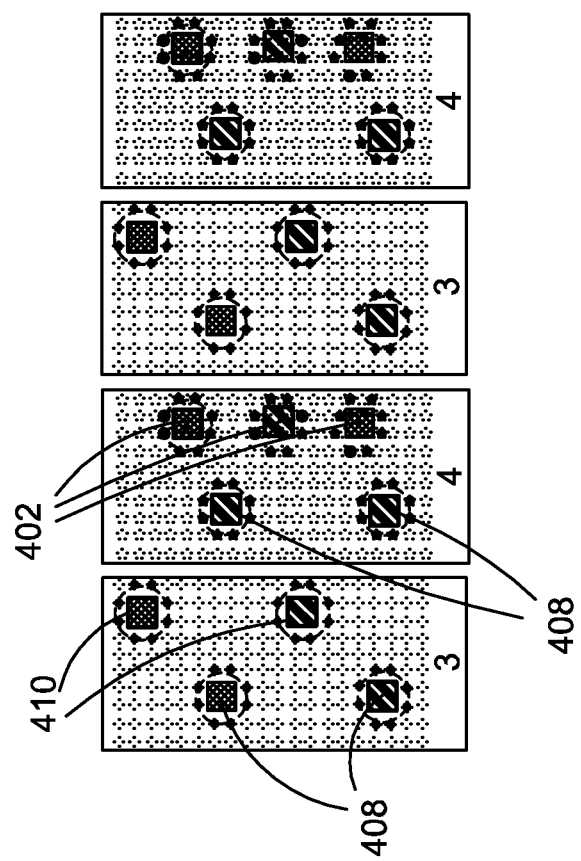
FIG. 4C is another exemplary test contact pattern of an interlaced probe card partition layout where dummy contact pattern insertion is not available.

FIG. 4C is another exemplary test contact pattern of an interlaced probe card partition layout where dummy contact pattern insertion is not available. Pads 408 have common locations (within each section) between interlaced section 3 and section 4. However, pads 410 in the section 3 and pads 412 in the section 4 have conflicting locations that are not compatible for dummy pattern insertion because they overlap or interfere with each other. Therefore, dummy pattern insertion for probe card reuse is not available and different probe cards are used for the section 3 and the section 4.

Figure 5:
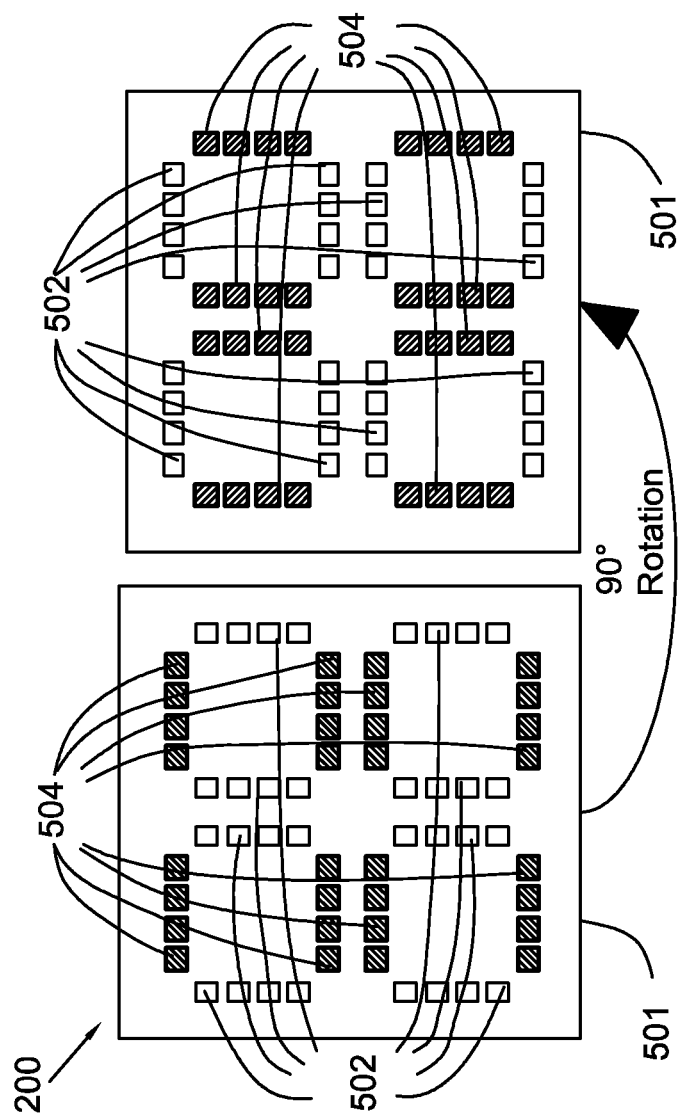
FIG. 5 is an exemplary probe card partition layout having a symmetric test contact pattern with respect to rotation by a given angle according to some embodiments.

FIG. 5 is an exemplary probe card partition layout having a symmetric test contact pattern with respect to rotation by a given angle according to some embodiments. The test contact pattern 500 for the probe card partition layout of an integrated circuit die includes pads (contacts) 502 and pads (contacts) 504. The test contact pattern 500 is arranged into the two contact patterns, for pads 502 and pads 504, respectively, that are symmetric with respect to rotation by 90°.

A probe card having the contact pattern for pads 502 can be used for probing on pads 502, then the integrated circuit die can be rotated by 90° and the same probe card can be reused for probing on pads 504 with the same contact pattern. Therefore, the probe card testing of the test contact pattern 500 with high pin count can be arranged into two contact patterns (e.g., for pads 502 and 504 respectively) having smaller number of pin counts and reusing the same probe cards for both contact patterns with rotation by 90°. In other embodiments, the test contact pattern may be arranged into more than two contact patterns that are symmetrical with respect to rotation by a specified angle, wherein the contact pattern and pin type (e.g., power, ground, signal, etc) remains the same after the rotation.

According to some embodiments, a method of probe card partitioning for testing an integrated circuit die includes providing a first probe card partition layout having a first number of distinct sections. Each distinct section uses a distinct probe card for testing. The first probe card partition layout is repartitioned into a second probe card partition layout having a second number of distinct sections. The second number is less than the first number.

According to some embodiments, a probe card partition layout includes at least two sections or at least two contact patterns, and at least one alignment mark. A first probe card is used for testing multiple sections of the at least two sections or for testing multiple contact patterns of the at least two contact patterns. The at least one alignment mark is used for tester alignment.

According to some embodiments, a method of probe card partitioning for testing an integrated circuit die includes providing a test contact pattern for at least one section of a probe card partition layout of the integrated circuit die. The test contact pattern is arranged into at least two contact patterns that are symmetric with respect to rotation by a specified angle. A probe card partition layout having the at least two contact patterns is provided.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of probe card partitioning for testing an integrated circuit die, comprising:
   repartitioning a first probe card partition layout of the integrated circuit die having a first number of distinct sections, each distinct section being configured to use a distinct probe card for testing, into a second probe card partition layout having a second number of distinct sections so that the second number is less than the first number;
   adding at least one dummy pad in at least one section of the second probe card partition layout, the at least one dummy pad being configured to make at least one other probe card of the second partition layout have a uniform test contact pattern with the distinct probe card; and
   using the distinct probe card for testing multiple section in the second probe card partition layout.

2. The method of claim 1, wherein the second probe card partition layout has a test contact pattern that is symmetric with respect to rotation by a specified angle.

3. The method of claim 1, wherein the same probe card is utilized for testing all sections of the second probe card partition layout.

4. The method of claim 1, wherein the second probe card partition layout has a first set of section areas interlaced with a second set of section areas.

5. The method of claim 4, further comprising utilizing the same probe card for testing the first set of section areas and the second set of section areas.

6. The method of claim 1, wherein a number of test contacts of each section of the second probe card partition layout is limited within a tester pin count specification.

7. The method of claim 1, further comprising adding at least one alignment mark to each section of the second probe card partition layout.

8. The method of claim 1, further comprising utilizing at least one distinct section in the second probe card partition layout for a backside probe card partition layout of the integrated circuit die.

9. A probe card partition layout, comprising:
   at least two sections, the at least two sections being configured to use a first probe card multiple times for testing, at least one of the two sections comprising at least one dummy pad, the at least one dummy pad being configured to make at least one other probe card of the at least two sections have a uniform test contact pattern with the first probe card; and
   at least one alignment mark,
   wherein the at least one alignment mark is used for tester alignment.

10. The probe card partition layout of claim 9, wherein the first probe card is used for testing all sections of the at least two sections.

11. The probe card partition layout of claim 9, wherein a second probe card is used for testing at least one section of the at least two sections and a second area of the second probe card is multiple times of a first area of the first probe card.

12. The probe card partition layout of claim 9, wherein multiple contact patterns of the at least two contact patterns are symmetric with respect to rotation by a specified angle.

13. The probe card partition layout of claim 9, wherein a first set of sections of the at least two sections are interlaced with a second set of sections of the at least two sections, and wherein the first probe card is used for testing the first set of sections and a second probe card is used for testing the second set of sections.

14. The probe card partition layout of claim 13, wherein the first probe card and the second probe card are the same.

15. The probe card partition layout of claim 9, wherein the first probe card is used for testing a backside of the integrated circuit die.

16. The probe card partition layout of claim 9, wherein a number of test contacts of each section of the probe card partition layout is limited within a tester pin count specification.

17. A method of probe card partitioning for testing an integrated circuit die, comprising:
arranging a test contact pattern for at least one section of a probe card partition layout of the integrated circuit die into at least two contact patterns that are symmetric with respect to rotation by a specified angle; and
rearranging the test contact pattern to provide a probe card partition layout having at least two contact patterns, the at least two contact patterns being configured to use a first probe card multiple times for testing,
wherein at least one of the two contact patterns comprises at least one dummy pad configured to make at least one other probe card of the at least two contact patterns have a uniform test contact pattern with the first probe card.

18. The method of claim 17, further comprising adding at least one alignment mark to the at least one section of the probe card partition layout.

19. The method of claim 18, further comprising using at least one contact pattern of the at least two contact patterns to test a backside of the integrated circuit die.

20. The method of claim 18, wherein at least one of the contact patterns has a first set of section areas interlaced with a second set of section areas.

* * * * *